(12) United States Patent
Tsujita (10) Patent No.: US 6,461,800 B1
(45) Date of Patent: Oct. 8, 2002

(54) RESIST PATTERNING METHOD

(75) Inventor: Kouichirou Tsujita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/537,311

(22) Filed: Mar. 29, 2000

(30) Foreign Application Priority Data

Sep. 29, 1999 (JP) .............................................. 11-276063

(51) Int. Cl.$^7$ ................................................. G03F 7/30
(52) U.S. Cl. ...................... 430/329; 430/322; 430/325; 430/434
(58) Field of Search ................................ 430/322, 325, 430/329, 434

(56) References Cited

U.S. PATENT DOCUMENTS 5,612,170 A * 3/1997 Takemura et al. ........ 430/270.1
5,840,445 A * 11/1998 Ikeda .............................. 430/5
6,114,082 A * 9/2000 Hakey et al. ............. 430/270.1
6,352,818 B1 * 5/2002 Hsich .......................... 430/322

OTHER PUBLICATIONS

Hiroshi Kawakami et al., Sub–100nm Pattern Formation using Ozone Asher, Jun. 18, 1998, pp. 60–65.

* cited by examiner

Primary Examiner—Mark F. Huff
Assistant Examiner—Nicole Barreca
(74) Attorney, Agent, or Firm—Oblon, Spivak, McClelland & Neustadt, P.C.

(57) ABSTRACT

A resist patterning method allows further fine patterning of semiconductor integrated circuits. First, a resist is formed on an underlying layer (1). The resist is selectively exposed, whereby an exposed portion and an unexposed portion are formed. Then, development processing of the resist is performed using a developing solution. In the development process, the resist in the exposed portion is removed at a first velocity and then the resist in the unexposed portion is removed at a second velocity lower than the first velocity, to thereby form a resist pattern (2).

3 Claims, 13 Drawing Sheets

RESIST PATTERNING METHOD

BACKGROUND OF THE INVENTION

1. Field of the Invention

The present invention relates to a method of patterning a resist used in the manufacture of a semiconductor integrated circuit.

2. Description of the Background Art

Advances in the technology of manufacturing semiconductor integrated circuits allow the circuits to become increasingly smaller. For further improvement in device performance, in recent years, it has become necessary to pattern a resist at a line size (width) of about 0.10 μm and a space size (gap width between patterns) of about 0.30 μm.

In conventional resist patterning methods, however, it was difficult to produce such a fine pattern.

SUMMARY OF THE INVENTION

A first aspect of the present invention is directed to a method of patterning a resist comprising the steps of: (a) forming a resist on an underlying layer; (b) selectively exposing the resist to form an exposed portion and an unexposed portion; and (c) after the step (b), performing development processing of the resist using a developing solution, wherein either of the exposed and unexposed portions defines a first region and the other defines a second region in which the velocity of dissolution with respect to the developing solution is lower than in the first region. The step (c) includes the steps of: (c-1) removing all the resist in the first region at a first velocity, and (c-2) after the step (c-1), continuing the development processing to remove the resist in the second region at a second velocity lower than the first velocity.

According to a second aspect of the present invention, the second region includes a plurality of third regions sectioned to the same size and shape by the first region, and there is at least a space of one third region between the plurality of third regions.

According to a third aspect of the present invention, each of the plurality of third regions is designed to form a slim wire.

The method of the first aspect allows further fine resist patterning, smaller in dimension than the exposed and unexposed portions which are distinguished by the selective exposure in step (b). Further, until the patterned resist is obtained, the resist is dissolved rapidly at the first velocity and then slowly at the second velocity. This allows a wide margin of time for fine patterning in the second region.

The method of the second aspect allows a wide margin of focus since there is at least a space of one third region between the plurality of third regions.

According to the method of the third aspect, the application of the present invention for the formation of slim wires is effective for fine patterning and a wide margin of focus.

An object of the present invention is to provide a method of patterning a resist that allows further fine patterning of semiconductor integrated circuits.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
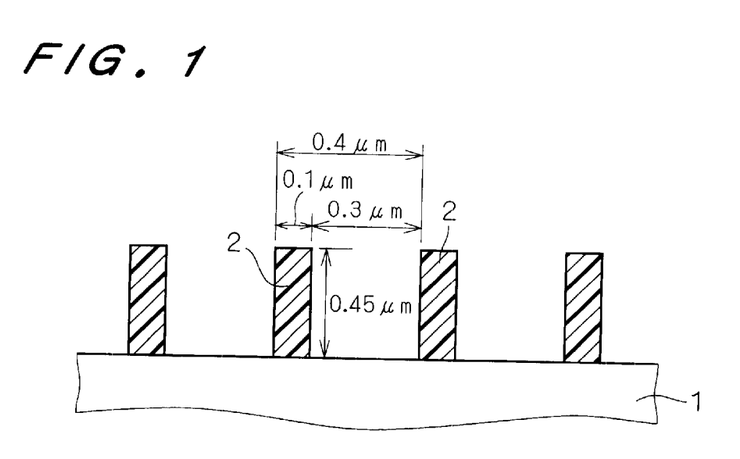
FIGS. 1, 3, 5, and 6 are cross-sectional views to explain a method of patterning a resist according to a first preferred embodiment of the present invention.
Figure 2:
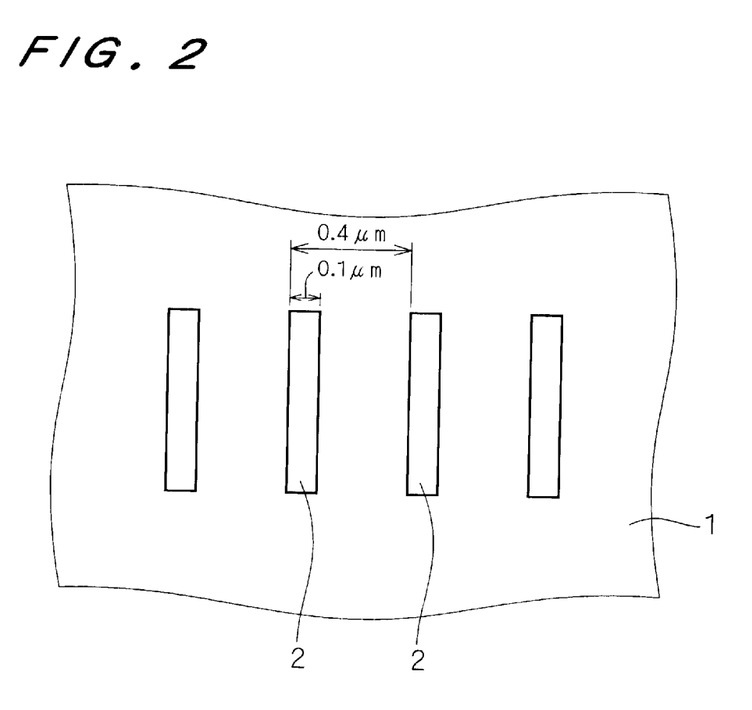
FIGS. 2 and 4 are plan views to explain the resist patterning method of the first preferred embodiment.

In a first preferred embodiment, a method of forming a patterned resist is first described. Here a resist with dimensions as shown in FIGS. 1 and 2 is taken as an example. FIG. 1 is a partial cross-sectional view of a semiconductor wafer, and FIG. 2 is a partial plan view of the wafer of FIG. 1 viewed from above.

As shown in FIGS. 1 and 2, resist patterns 2 are formed on an underlying layer 1. Each resist pattern 2 should preferably have a line size of 0.10 μm, a space size of 0.30 μm, and a height of 0.45 μm. A sum of the desired line and space sizes, i.e., pitch, is 0.4 μm.

The underlying layer 1, which is formed under the resist patterns 2, is for example an aluminum layer for the formation of aluminum wiring. By means of etching using resist patterns 2 for slim wires as masks, the underlying layer 1 is patterned to form aluminum wiring.

Figure 3:
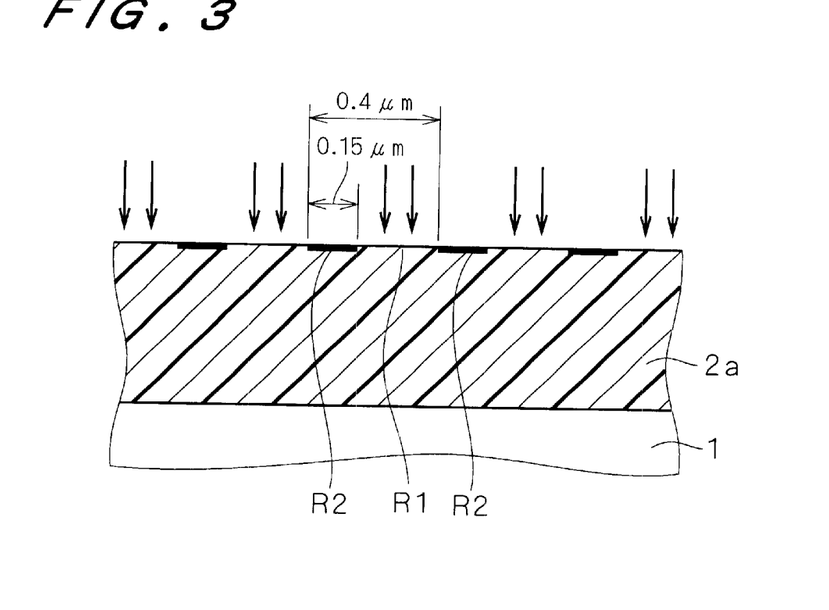
Figure 4:
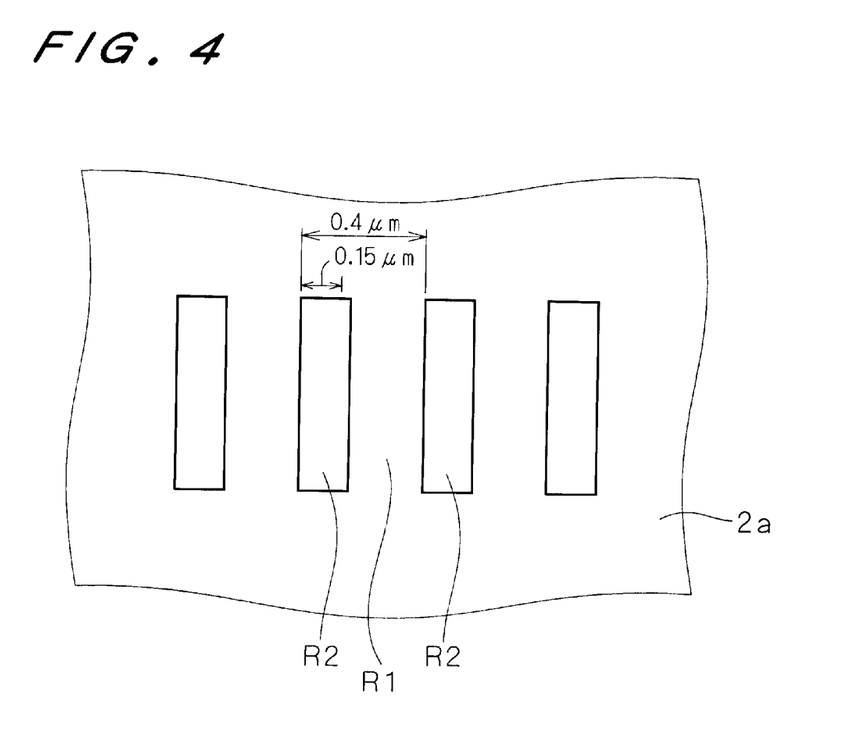
Figure 5:
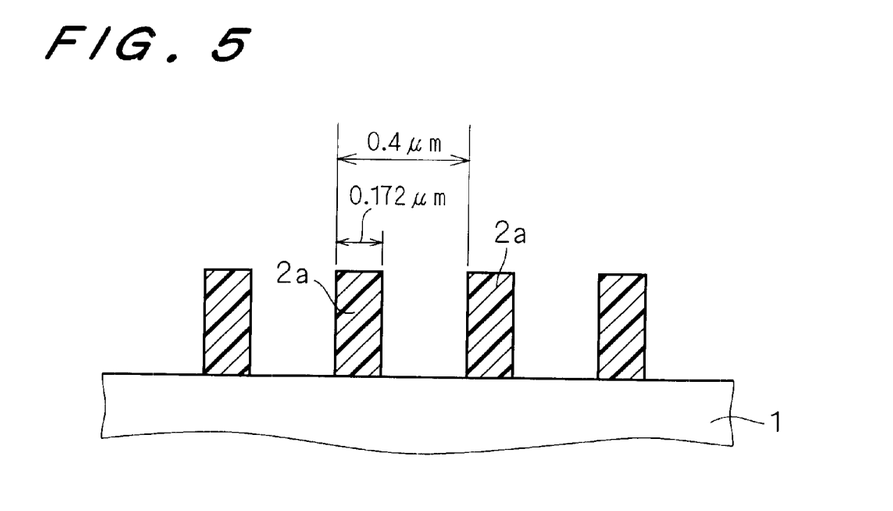
Figure 6:
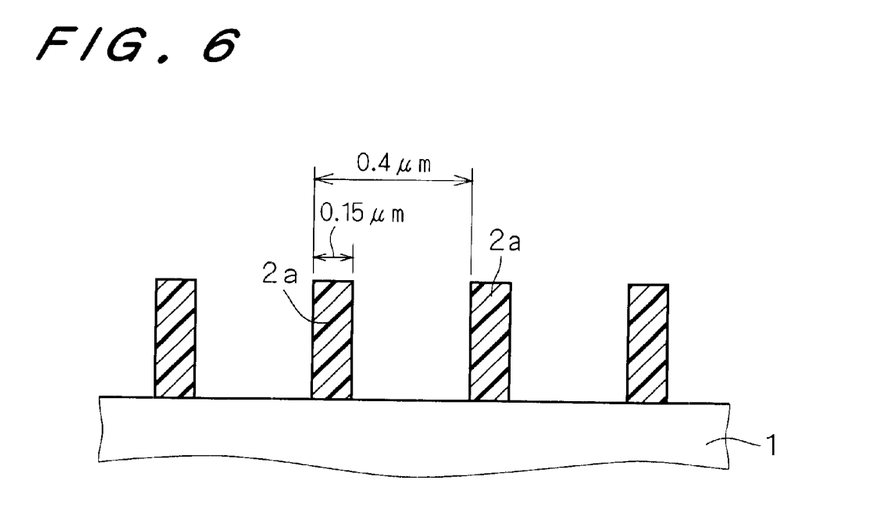

A method of forming the structure of FIGS. 1, 2 is described with reference to FIGS. 3 to 7. FIGS. 3, 5, 6 are partial cross-sectional views of a semiconductor wafer, and FIG. 4 is a partial plane view of the structure of FIG. 3, viewed from above, in exposed condition.

Figure 7:
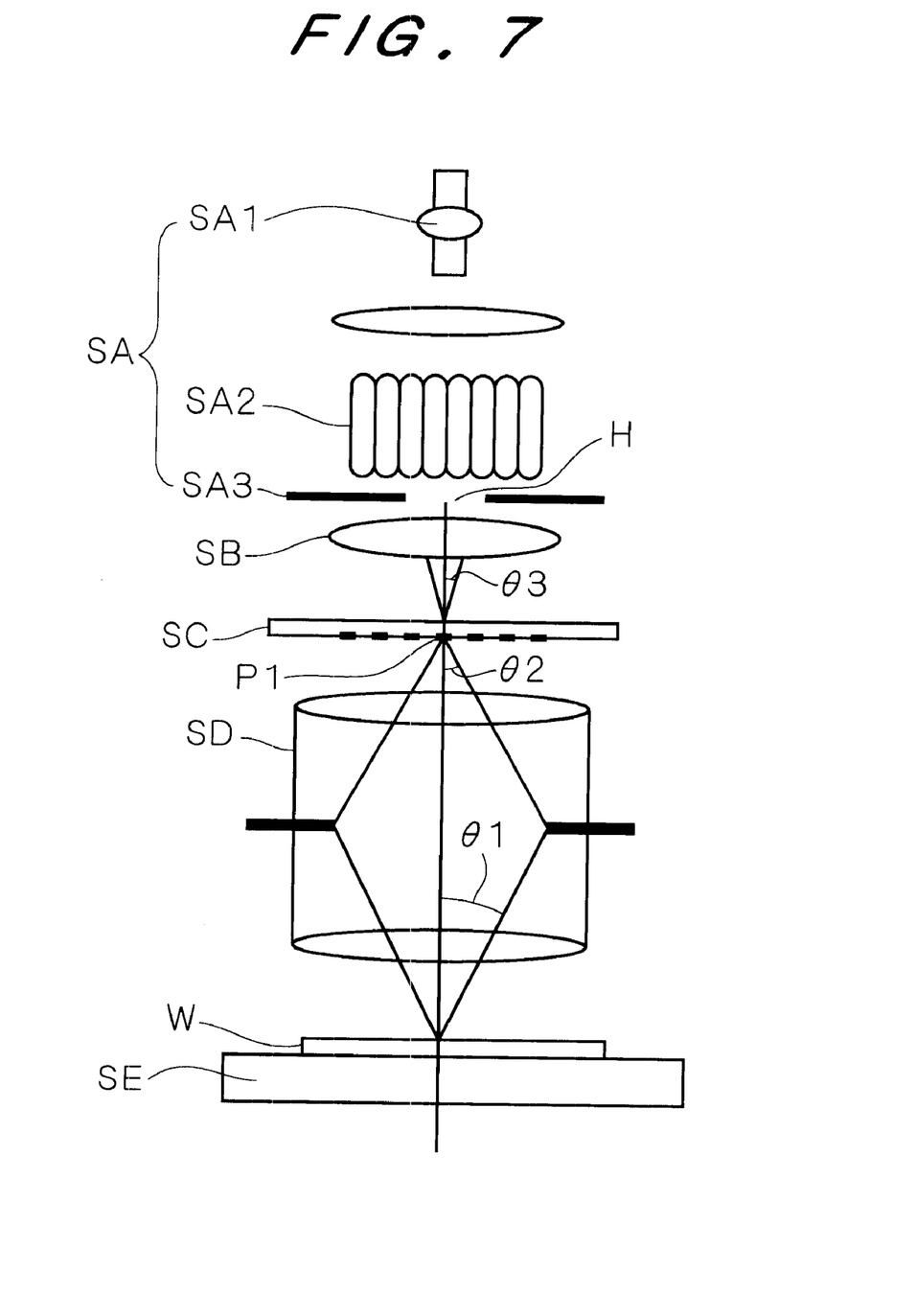
FIG. 7 is a schematic diagram of an exposure apparatus used in the resist patterning method of the first preferred embodiment.

FIG. 7 shows a stepper as an example of exposure apparatuses. The exposure apparatus of FIG. 7 comprises lighting equipment SA, a capacitor lens SB, a reticle SC, a projection lens SD, and a stage SE on which a semiconductor wafer W is placed. The lighting equipment SA includes a light source SA1, a fly eye lens SA2, and a light shielding plate SA3. In broad outline, the lighting equipment SA emits exposure light. The light from the lighting equipment SA illuminates the semiconductor wafer W on the stage SE through the capacitor lens SB, the reticle SC, and the projection lens SD. In this fashion, a resist formed on the semiconductor wafer W is exposed through the reticle SC. This allows a pattern P1 to be transferred from the reticle SC, to the surface of the resist on the semiconductor wafer W. The focus of the pattern 1 can be adjusted by the projection lens SD.

Returning to the description of the method of forming a resist, a positive-type resist 2a having a thickness of 0.50 μm is applied on the underlying layer 1.

Figure 20:
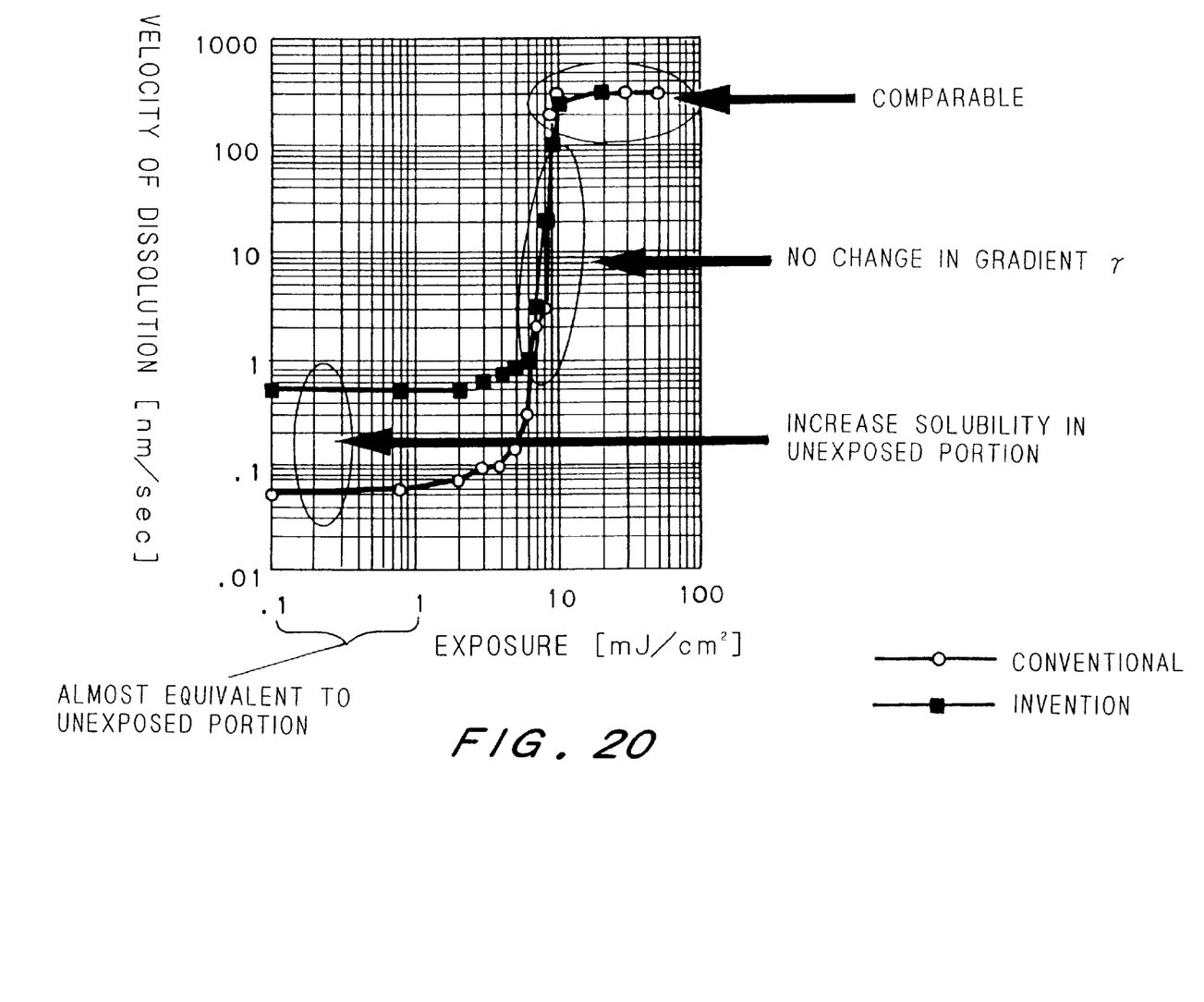
FIGS. 20 and 21 are graphs to explain a method of patterning a resist according to a second preferred embodiment of the present invention.

The pattern P1 is then transferred from the reticle SC to the surface of the resist 2a on the semiconductor wafer W by using an exposure apparatus. Accordingly, the resist 2a is selectively exposed to light, whereby first and second regions are formed. In the first preferred embodiment, the first region is defined as an exposed portion R1 and the second region is defined as an unexposed portion R2. The exposed portion R1 is part of the pattern P1 from the reticle SC, which is irradiated with exposure light. The unexposed portion R2 is part of the resist 2a which is not irradiated with exposure light. The pitch of the unexposed portion R2 is set at the desired size of 0.40 μm. The line size of the unexposed portion R2 should be larger than the desired size of 0.10 μm; here it is set at 0.15 μm. A plurality of unexposed portions R2 are sectioned to the same size and shape by the exposed portions R1. Since the resist 2a is the positive type, the velocity of dissolution in the unexposed portion R2 will be lower than that in the exposed portion R1. The velocity of dissolution indicates the amount of the resist 2a dissolved in the developing solution per unit time. In the graph of FIG. 20, for example, the velocity of dissolution of the respective exposed/unexposed portions R1, R2 are determined by controlling the amount of exposure.

Next, development processing of the resist 2a is performed using a developing solution. Here the semiconductor wafer W is dipped into a developing solution only for 185 seconds (developing time). The developing solution is tetra methyl ammonium hydroxide (TMAH), for example. This process leaves part of, the resist 2a in the unexposed portion R2 as a resist pattern 2 of the desired size.

The developing time of 185 seconds is previously derived from the velocity of dissolution of the respective exposed/unexposed portions R1, R2 with respect to the developing solution, the size of the exposed portion R1, and the desired size of the resist pattern 2. More specifically, the length of time required to dissolve the resist 2a in the exposed portion R1 can be derived from the velocity of dissolution and the size of the exposed portion R1; and the length of time required to dissolve the resist 2a in the unexposed portion R2 can be derived from the velocity of dissolution of the unexposed portion R2 and the desired size of the resist pattern 2. Accordingly, a sum of those lengths of time becomes the developing time.

The development processing of the semiconductor wafer W starts when the wafer W is dipped into the developing solution. Since the velocity of dissolution in the exposed portion R1 is very high (=first velocity of about 0.1 μm /sec), only 5 seconds of development results in the structure of FIG. 5. Removed in the direction of thickness, the resist 2a is almost nonexistent in the exposed portion R1. At this time, the line size of the resist 2a is 0.172 μm which is slightly larger than the size of the unexposed portion R2. The velocity of dissolution rapidly decreases from the condition of FIG. 5, approaching 0.2 nm/sec (=0.0002 μm/sec). Since the resist 2a is dissolved from both sides, the velocity of dissolution is substantially twice, i.e., about 0.4 μm/sec. Thus, it takes another 55 seconds (=(0.172−0.150)/0.0004) from the condition of FIG. 5 to have the resist 2a having the same line size of 0.15 μm as the unexposed portion R2 (c.f., FIG. 6). In this fashion, the resist 2a in the exposed portion R1 is removed in the direction of thickness at the first velocity (>0.2 nm/sec) and then etched in the direction of width at a lower second velocity of about 0.2 nm/sec.

The velocity of dissolution continues to be about 0.2 nm/sec from the condition of FIG. 6. With another 125 seconds (=(0.150−0.100)/0.0004) of development from the condition of FIG. 6, the resist 2a becomes a resist pattern 2 of the desired size. In this fashion, the resist 2a in the unexposed portion R2 is removed at the second velocity (=0.2 nm/sec) lower than the first velocity.

Since the 185 seconds of development isotropically etches at least 0.037 μm (=185×0.0004) of the resist 2a, the resist pattern 2 will almost have the desired height of 0.45 μm. The pitch of the resist pattern 2 remains 0.4 μm since the adjacent resists 2a are dissolved in an analogous fashion.

As above described, a resist pattern 2 of the desired size which is finer than that in the unexposed portion R2 is produced. Until the resist pattern 2 is obtained, all the resist 2a in the exposed portion R1 is dissolved rapidly at the first velocity (>0.2 nm/sec) and then the development processing is continued to dissolve the resist 2a in the unexposed portion R2 slowly at the second velocity. This allows a wide margin of time for fine patterning in the unexposed portion R2. Subsequent predetermined processes then complete a semiconductor device which includes a semiconductor integrated circuit formed on the basis of the fine resist patterns 2.

The size of the unexposed portion R2 should be larger than the desired size of the resist pattern 2 as above described. That is not to say that any larger size is available, but there is a preferable range. This is considered from simulations.

Figure 10:
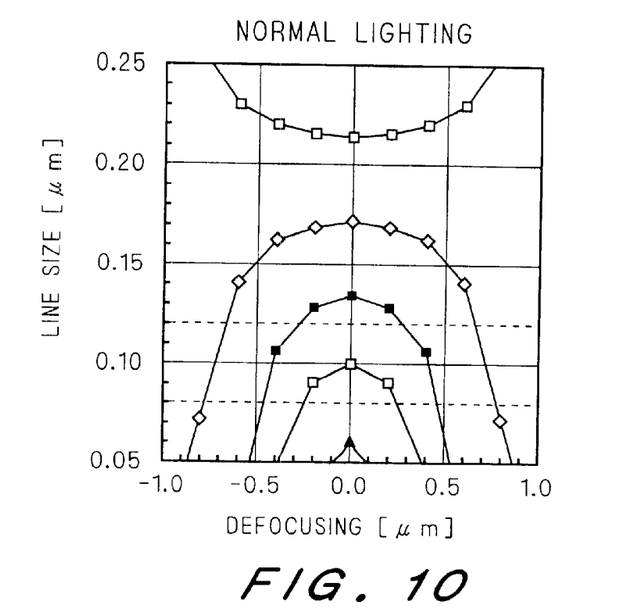
FIGS. 10 to 15 are graphs to explain the resist patterning method of the first preferred embodiment.

A simulation is run with a pattern P1 of the reticle SC having almost the desired line and space sizes of 0.10 μm and 0.30 μm, respectively. The result is shown in FIG. 10. In FIG. 10, the horizontal axis indicates the amount of defocusing (μm), and the vertical axis indicates the line size of the resist pattern 2 (μm) which is measured 60 seconds after the start of development. The wavelength of exposure light is set at 248 nm (KrF), and the numerical aperture (lens size) of the projection lens SD at NA=sin θ1=0.55. Lighting is normal lighting (σ=0.8). Here, sin θ2=NA/m and sin θ3=σ× sin θ2, where m is the multiplying factor and σ is the degree of coherence. In the normal lighting, an aperture H of the light shielding plate SA3 is as in the form shown in FIG. 8. The amount of exposure (mJ/cm$^2$) varies in increments of 10% (i.e., the upper curve in the graph, the smaller is the amount of exposure). Defocusing indicates a deviation from the condition where the focus is adjusted on the surface of the resist 2a.

Now, consider the case where a resist pattern 2 having the sane line size (sizing level) with the pattern P1 of the reticle SC is formed. We assume that the line size of the resist pattern 2 has a tolerance of ±0.02 μm and the amount of defocusing varies between ±0.8 μm. In this case, it can be seen from FIG. 10 that there is no such amount of light exposure that a resist pattern 2 having the line size of 0.1 μm±0.02 μm can be formed in view of variations in defocusing. That is, the formation of the resist pattern 2 of this size is impossible.

Figure 8:
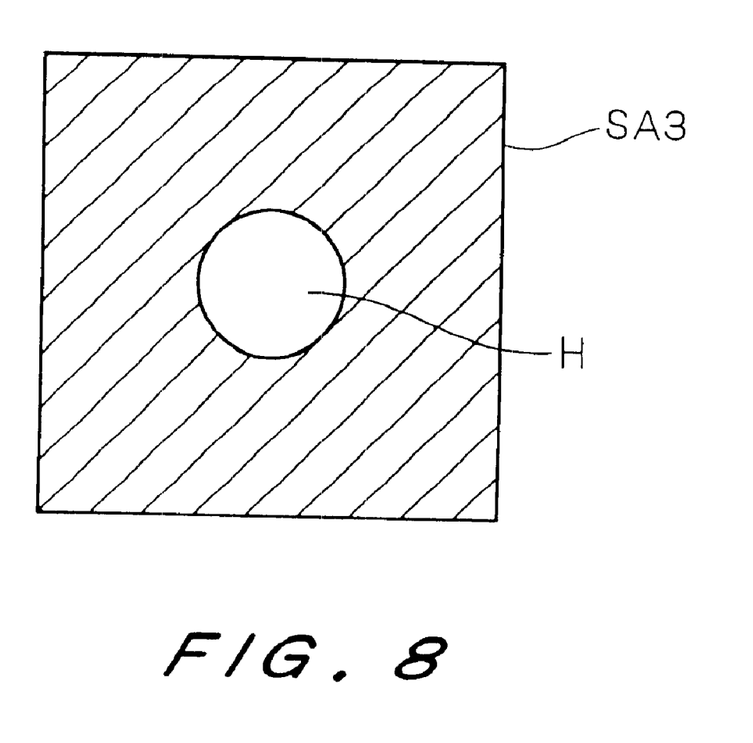
FIG. 8 is a plan view showing normal lighting to explain the resist patterning method of the first preferred embodiment.
Figure 9:
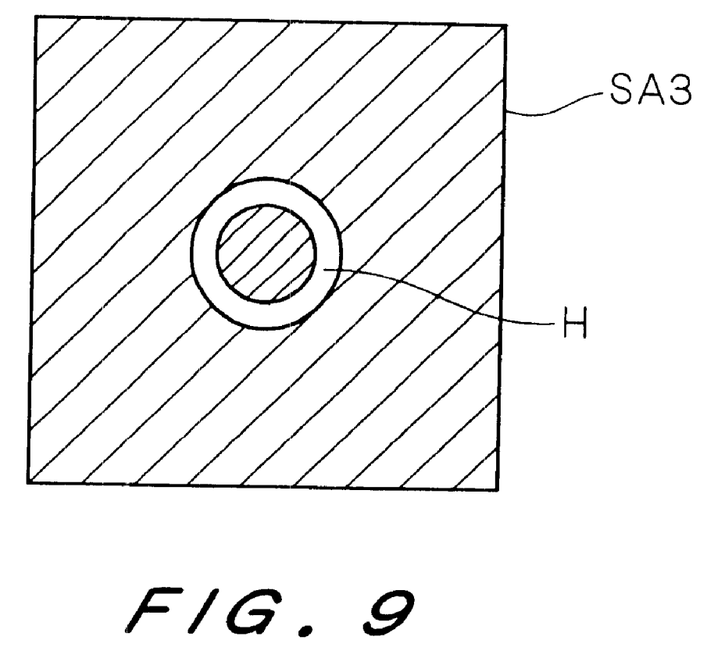
FIG. 9 is a plan view showing deformation lighting to explain the resist patterning method of the first preferred embodiment.
Figure 11:
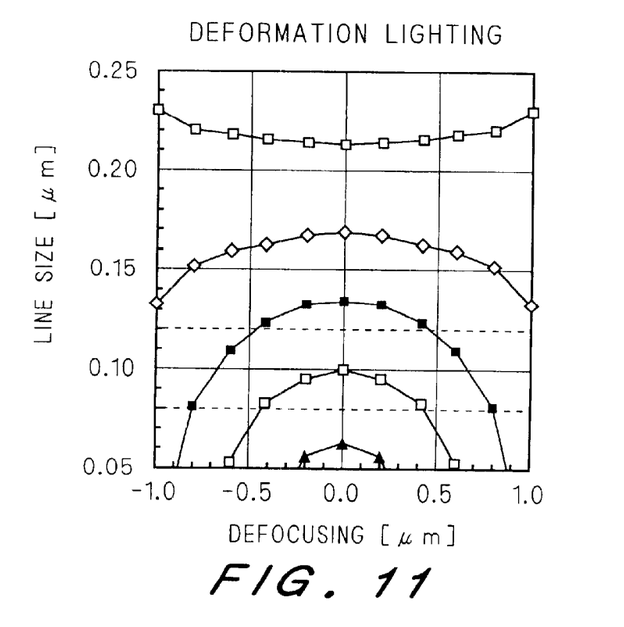

The same simulation as for the normal lighting is run for deformation lighting. In the deformation lighting, a ⅔ orbicular zone as shown in FIG. 9, i.e., a shielding circle having a radius of two-thirds of the aperture H in the normal lighting of FIG. 8, is concentrically provided. The simulation result is shown in FIG. 11. In this case, also, there is no such amount of light exposure that a resist pattern 2 of the sizing level having a tolerance of ±0.02 μm can be formed in view of variations in defocusing.

Figure 12:
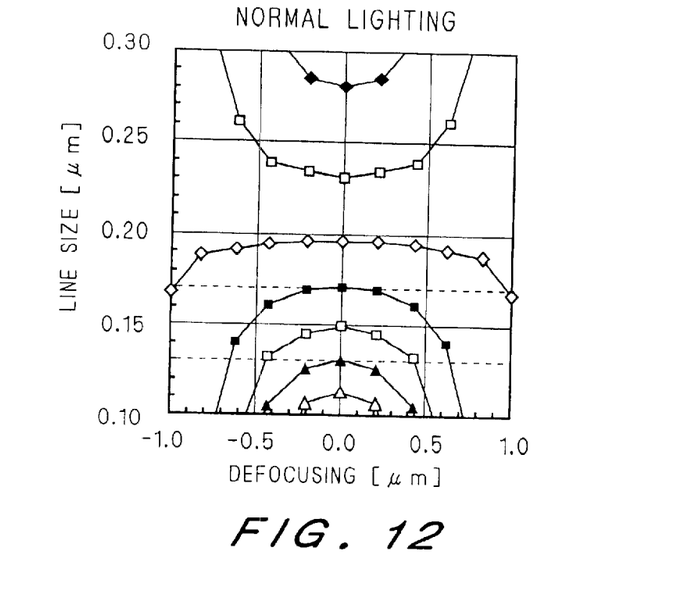
Figure 13:
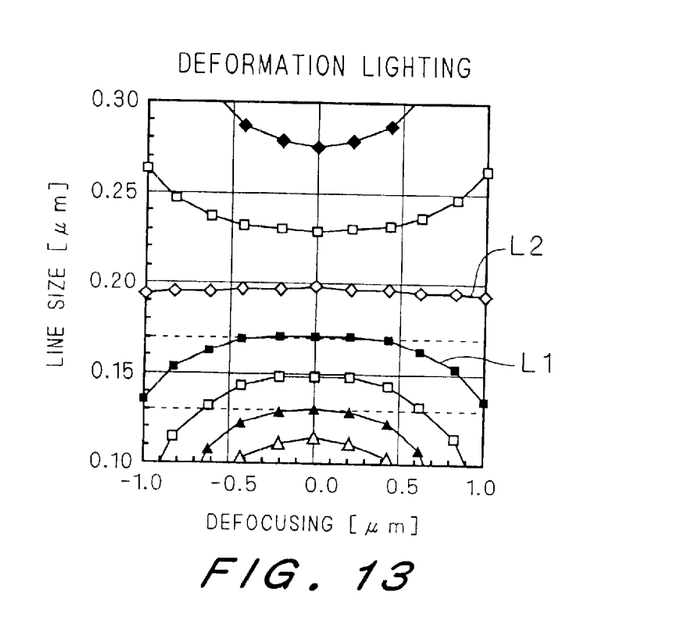

Next, similar simulations are performed with the unexposed portion R2 having a line size of 0.15 μm, which is larger than the desired size of 0.10 μm, and a space size of 0.25 μm. The results are shown in FIGS. 12, 13. FIG. 12 shows the normal lighting, and FIG. 13 shows the deformation lighting. In the case of FIG. 12, there is no such amount of light exposure that a resist pattern 2 of the sizing level having a tolerance of ±0.02 μm can be formed in view of variations between ±0.8 μm in defocusing.

In the case of FIG. 13, however, there is such amount of light exposure that a resist pattern 2 of the sizing level having a tolerance of ±0.02 μm can be formed even if the amount of defocusing varies in the range of ±0.8 μm or over (see L1 in graph). With a certain amount of exposure, further, the line size becomes almost constant (about 0.20 μm) even with variations in defocusing (see L2 in graph). In FIG. 13, the line size is kept at a constant value of 0.19 μm, which is larger than the sizing level of 0.15 μm by 0.04 μm. In this fashion, the line size should be equal to or smaller than the space size, i.e., there should be at least a space of one unexposed portion R2 between adjacent unexposed portions R2 (third regions). This increases the margin of defocusing.

We further conducted experiments on the same line and space sizes. FIGS. 14 to 17 show the experimental data. In the experiments, both the line size of the unexposed portion R2 and the space size are set at 0.30 μm.

Figure 14:
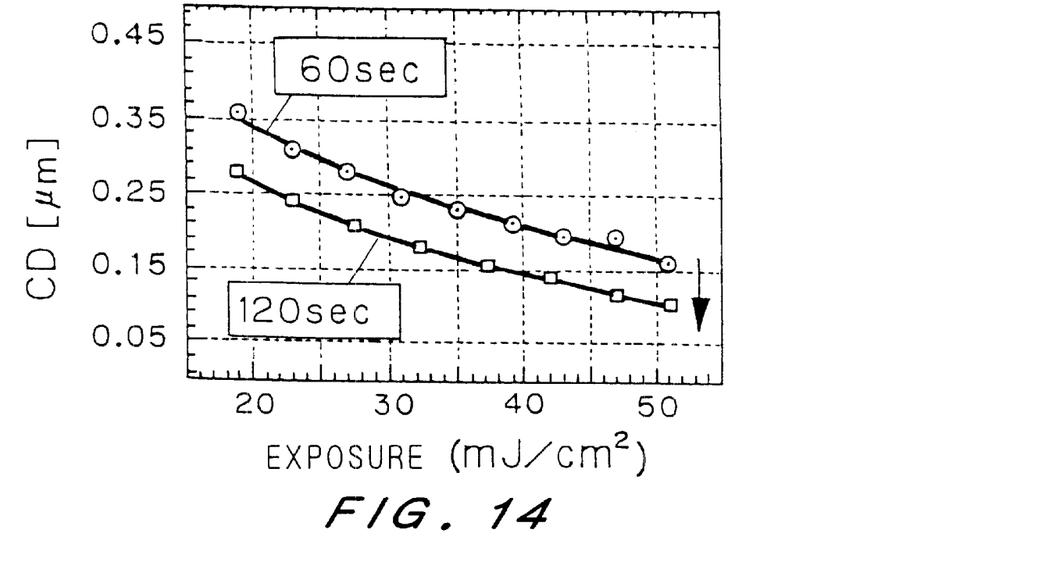

FIG. 14 is a graph showing the relationship between the amount of exposure and the line size CD of a resist. As shown, this experiment is carried out with varying amounts of exposure. Even if the amount of exposure varies, the amount of the resist removed between 60 and 120 seconds after the start of development: is almost constant.

Figure 15:
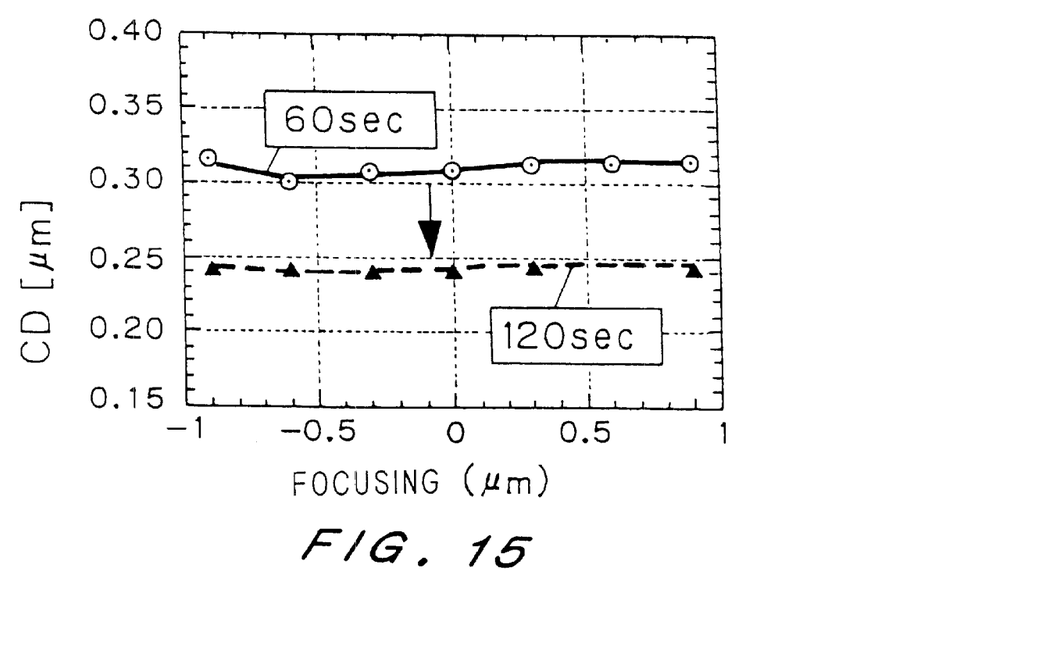

FIG. 15 is a graph showing the relationship between the focus and the line size CD of a resist. As shown, this experiment is carried out with varying focuses. Even if the focus varies, the amount of the resist removed between 60 and 120 seconds after the start of development is almost constant.

The above experiments show that the amount of the resist removed with time from the start of development can be stabilized irrespective of the focus and the amount of exposure, as long as the line size of the unexposed portion R2 and the space size are the same.

Figure 16:
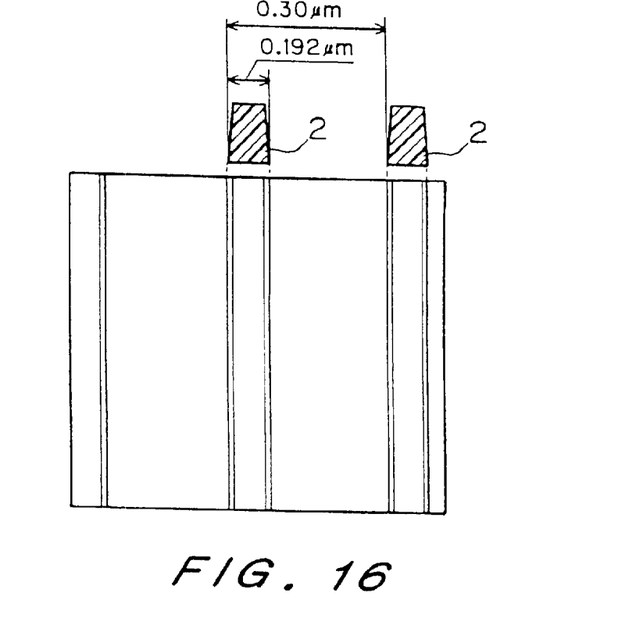
FIGS. 16 and 17 are schematic diagrams of experimental photographs to explain the resist patterning method of the first preferred embodiment.
Figure 17:
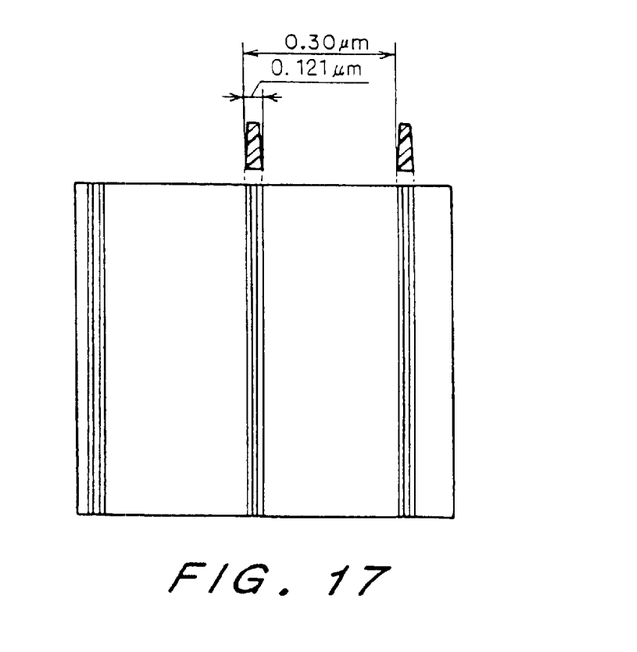

FIGS. 16 and 17 are schematic diagrams of SEM photographs of the resist pattern 2 in the above experiments, taken from above. FIG. 16 gives a photo taken 60 seconds after the start of development, and FIG. 17 gives a photo taken 120 seconds after the start of development. According to a critical dimension measurement (SEM), the line size of the resist pattern 2 is 0.192 μm after 60-second development and 0.121 μm after 120-second development.

Figure 18:
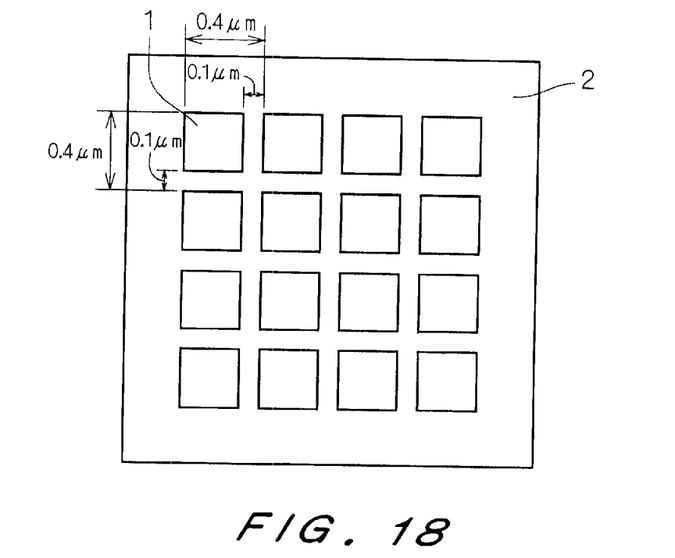
FIGS. 18 and 19 are plan views to explain the resist patterning method of the first preferred embodiment.
Figure 19:
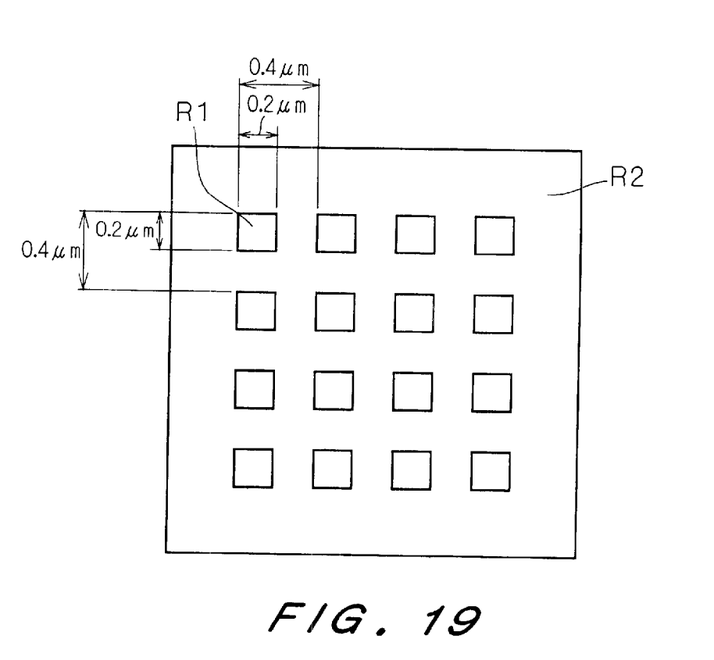

The foregoing description gives the resist pattern 2 for slim wires, but the resist pattern 2 may be in other forms. An example is shown in FIG. 18. FIG. 18 is a partial plan view of a semiconductor wafer W viewed from above. The resist pattern 2 of FIG. 18 has a lot of polygon holes, and the underlying layer 1 is exposed in the bottom surfaces of the holes. FIG. 19 is a partial plan view illustrating exposure viewed from above, which is made to obtain the resist pattern 2 of FIG. 18. Exposed portions R1 of polygons in FIG. 19 correspond to the polygon holes in FIG. 18.

The polygon holes in FIG. 18 and the exposed portions R1 in FIG. 19 are all in the form of squares. This is because, as in the case of the line space pattern, the maximum margin of defocusing is obtained when the size of the exposed portions R1 is equal to the size of the unexposed portions R2. In FIG. 18, the unexposed portions R2 has a pitch of 0.4 μm and a space size of 0.2 μm. Thus, a resist pattern 2 as shown in FIG. 19, wherein the unexposed portions R2 have a line size of 0.1 μm, can be obtained through the same development processing as in the case of the line space pattern.

Second Preferred Embodiment

In the first preferred embodiment, part of the resist 2a in the unexposed portion R2 is removed, so that the developing time becomes longer than in conventional methods. A second preferred embodiment is to increase the velocity of dissolution in the unexposed portion R2 so as to be comparable in the developing time to the conventional methods.

For example, the velocity of dissolution in the unexposed portion R2 is set at 0.0008 μm. If the line size of the resist 2a measured 5 seconds after the start of development is 0.172 μm as in the first preferred embodiment, only another 45 seconds (=(0.172−0.1)/(0.0008×2)) of development, i.e., in less than 50 seconds in total, is required to obtain a resist pattern 2 having a line size of 0.1 μm . If the exposure time is short and the line size of the resist 2a measured 5 seconds after the start of development is 0.188 μm , another 55 seconds (=(0.188−0.1)/(0.0008×2)) of development is required.

The characteristic curves of the velocity of dissolution in two kinds of resists are shown in FIG. 20. The velocity of dissolution in the unexposed portion R2 is 0.05 nm/sec in one resist and 0.5 nm/sec in the other resist. If the velocity of dissolution in the unexposed portion R2 is in the range of 0.2 nm/sec (point of change in the characteristic curve of one resist) to 1.5 nm/sec (point of change in the characteristic curve of the other resist), the developing time in the present invention can be comparable to the standard developing time in the conventional methods.

Figure 21:
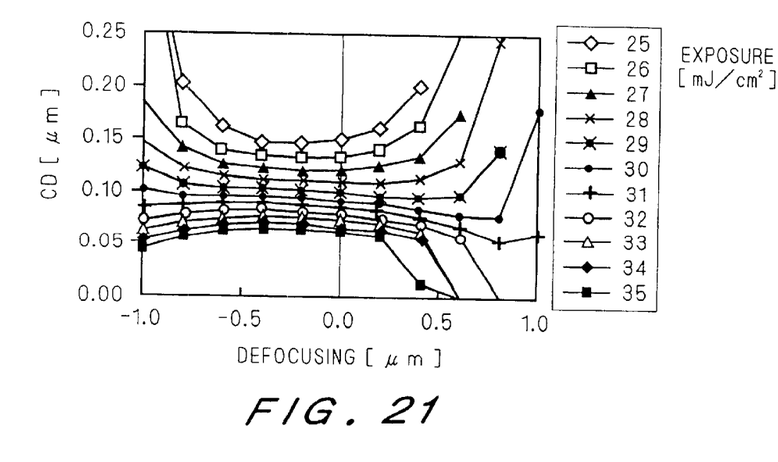
Figure 22:
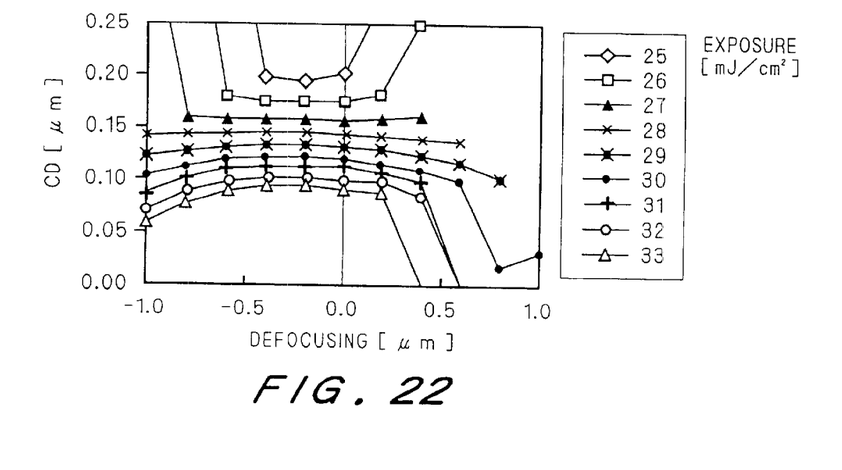
FIG. 22 is a graph to explain a conventional resist patterning method.

The two resists in FIG. 20 are both KrF. The resist of KrF protects part of hydroxyl in a PHS resin. The velocity of dissolution can be increased by reducing the rate of protection, which is possible for example by controlling the ratio of PVP (Poly-Vinyl-Phenol) to t-BOC (tertiary Butoxy Carbonyl) in the resist. However, a reduction in the rate of protection is generally followed by a reduction in the rate of change in the velocity of dissolution (gradient γ) which determines sharpness of the change in the velocity of dissolution between the exposed portion R1 and the unexposed portion R2. In FIG. 20, the gradient γ of the curve for the resist of the present invention is smooth. In order not to make the gradient γ too slow, an additive such as basic amine is applied to the resist. FIGS. 21 and 22 show simulation results with these two resists.

In FIG. 21 and 22, the horizontal axis indicates the amount of defocusing (μm), and the vertical axis indicates the line size (μm) of a resist pattern 2, in view of the amount of defocusing, which is measured 60 seconds after the start of development. The wavelength of exposure light is set at 248 nm (KrF) and the numeral aperture (lens size) NA of the projection lens SD at 0.6. Lighting is normal lighting (σ=0.75). The line and space sizes of the pattern P1 of the reticle SC are set at 0.14 μm and 0.24 μm, respectively. Further, TARC and BARC (ARC=reflection reducing coating) are applied to the upper and lower surfaces of the resist 2a, respectively, in order to improve dimension accuracy. The thickness of the TARC, the resist 2a, and the BARC are 430 Å, 7600 Å, 800 Å, respectively. FIG. 21 shows the resist in the present invention, and FIG. 22 shows the conventional resist. The simulations are run with, varying amounts of exposure (i.e., the upper curve in the graph, the smaller is the amount of exposure).

For the conventional resist of FIG. 22 the line size CD least affected by the amount of defocusing, i.e., pivotal size, is about 0.15 μm. When the amount of exposure is set so that the line size CD measured 60 seconds after the start of development will be 0.10 μm, variations in defocusing considerably changes the line size CD.

For the present resist of FIG. 21, on the other hand, the pivotal size is in the range of about 0.08 to 0.09 μm. With this resist, the resist pattern 2 having a line size of about 0.1 μm is obtained only with the same developing time as in the conventional methods and with a wider margin of defocusing than in the conventional methods.

It has conventionally been said that a difference in the velocity of dissolution between the exposed portion R1 and the unexposed portion R2 should be widened in order to prevent a change in resist dimension irrespective of variations in defocusing. However, it is found from FIG. 21 that the amount of resists to be removed most varies at the boundary between the exposed portion R1 and the unexposed R2. These variations can be reduced by making the gradient γ considerably sharp, since the time required to shift the velocity of dissolution from the level of the exposed portion to the level of the unexposed portion (e.g., 300 nm/sec to 0.4 nm/sec for the present resist of FIG. 21) is shortened. Accordingly, even if the velocity of dissolution in the unexposed portion is increased, a change in resist dimension can be prevented irrespective of variations in defocusing as long as the gradient γ is sharp.

Modification

While the aforementioned resist 2a is the positive type, it may be a negative type. For a negative-type resist, the velocity of dissolution in the exposed portion (second region) with respect to the developing solution is lower than that in the unexposed portion (first region).

While the invention has been shown and described in detail, the foregoing description is in all aspects illustrative and not restrictive. It is therefore understood that numerous modifications and variations can be devised without departing from the scope of the invention.

What is claimed is:

1. A method of patterning a resist, comprising the steps of:
   (a) forming a resist on an underlying layer;
   (b) selectively exposing said resist to form an exposed portion and an unexposed portion; and
   (c) after said step (b), performing development processing of said resist using a developing solution,
   wherein one of said exposed portion and said unexposed portion defines a first region and another of said exposed portion and said unexposed portion defines a second region in which a velocity of dissolution with respect to said developing solution of a second region resist in said second region is lower than a velocity of dissolution of a first region resist in said first region,
   said step (c) including the steps of:
   (c-1) removing said first region resist at a first velocity; and
   (c-2) after said step (c-1), continuing said development processing to remove a part of said second region resist at a second velocity lower than said first velocity,
   wherein a separation space of at least a size of a third region exists between a plurality of third regions sectioned by said first region, said plurality of third regions comprising original areas of said second region prior to said step (c-2).

2. The method according to claim 1, wherein each of said plurality of third regions is designed to form a wire.

3. The method according to claim 1, wherein
   said velocity of dissolution with respect to said developing solution in said second region is in a range of 0.2 to 1.5 nm/sec.

* * * * *